United States Patent
Lee et al.

(10) Patent No.: US 8,445,346 B2
(45) Date of Patent: May 21, 2013

(54) METHOD OF REDUCING WORDLINE SHORTING

(75) Inventors: Hong-Ji Lee, Taoyuan (TW); Nan-Tsu Lian, Hsunchu (TW); Kuang-Chao Chen, Hsinchu (TW)

(73) Assignee: Macronix International Co., Ltd. (TW)

( * ) Notice: Subject to any disclaimer, the term of this patent is extended or adjusted under 35 U.S.C. 154(b) by 296 days.

(21) Appl. No.: 12/611,614

(22) Filed: Nov. 3, 2009

(65) Prior Publication Data

US 2011/0104881 A1 May 5, 2011

(51) Int. Cl.
*H01L 21/8247* (2006.01)

(52) U.S. Cl.
USPC ................................ 438/257; 257/E21.561

(58) Field of Classification Search
USPC ........... 438/585–595, 257–267; 257/E21.561
See application file for complete search history.

(56) References Cited

U.S. PATENT DOCUMENTS

| | | | | |
|---|---|---|---|---|
| 5,436,481 A | * | 7/1995 | Egawa et al. | 257/324 |
| 5,545,578 A | * | 8/1996 | Park et al. | 438/303 |
| 6,723,608 B2 | * | 4/2004 | Hayakawa | 438/299 |
| 6,875,679 B2 | * | 4/2005 | Agarwal | 438/592 |

FOREIGN PATENT DOCUMENTS

| | | |
|---|---|---|
| CN | 1667817 A | 2/2005 |
| CN | ZL200510051125 | 4/2007 |
| KR | 2006113224 A * | 11/2006 |

OTHER PUBLICATIONS

Office action from Chinese patent application 200910246263.X dated Aug. 8, 2012.

* cited by examiner

*Primary Examiner* — Richard Booth
(74) *Attorney, Agent, or Firm* — Baker & McKenzie LLP

(57) ABSTRACT

A method of fabricating a memory device includes providing a substrate having an insulating layer, forming first, second, and third conductive layers on the insulating layer, forming a mask on the third conductive layer, etching through the third conductive layer and a first portion thickness of the second conductive layer using the mask to provide an etched sidewall portions of the third conductive layer and an etched upper surface of the second polysilicon layer, and forming a liner layer along the etched sidewall portions and the etched upper surface.

21 Claims, 3 Drawing Sheets

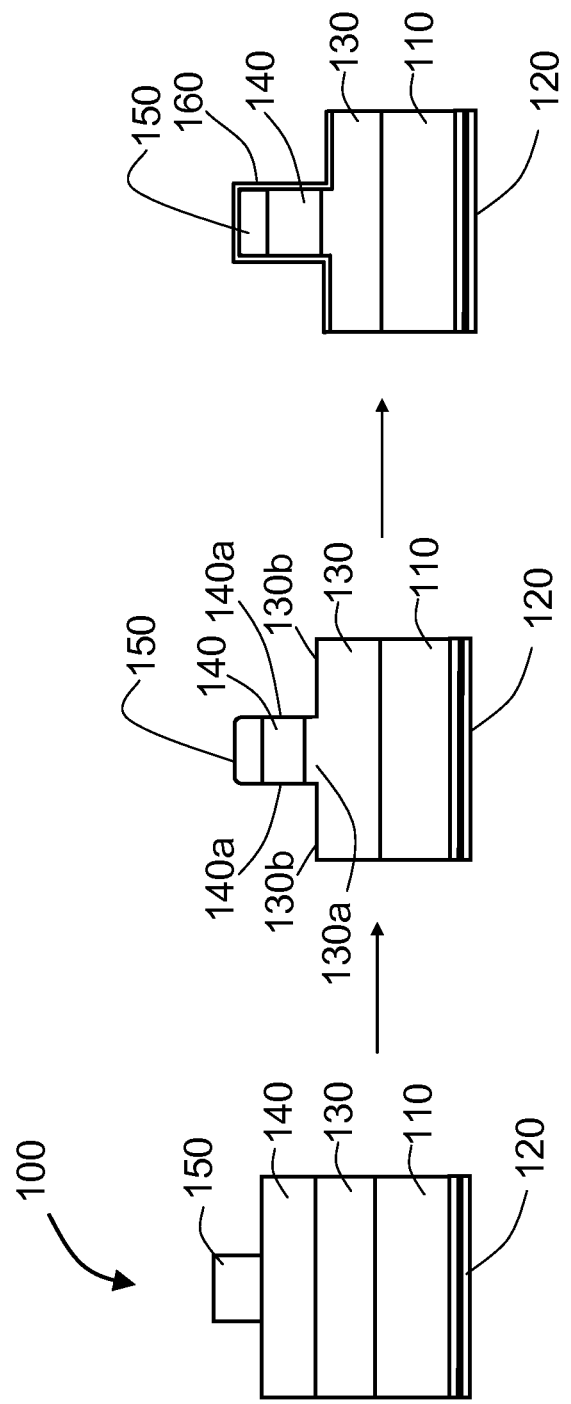

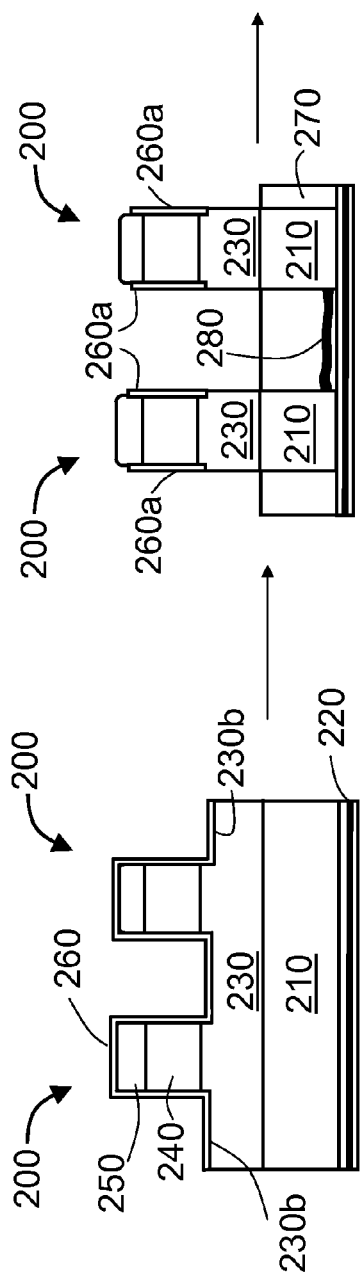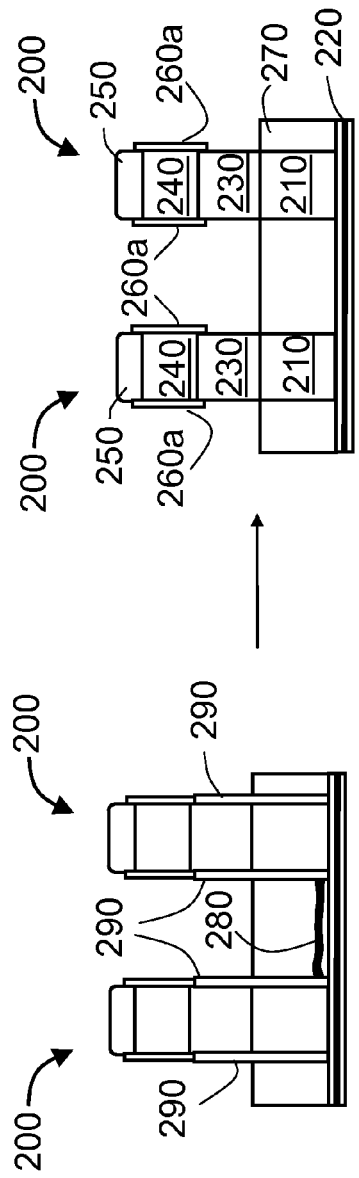

METHOD OF REDUCING WORDLINE SHORTING

BACKGROUND

1. Technical Field

The present invention relates to a flash memory device, and more particularly, to a method of fabricating a memory device by reducing electrical shorting between wordlines.

2. Related Art

During conventional fabrication of flash memory devices, layers of polysilicon are commonly etched in order to form wordlines (WLs). However, etching of the polysilicon can created polysilicon stringers formed between adjacent wordlines (WLs). Accordingly, the adjacent WLs are electrically interconnected, thereby creating an inoperative memory device due to formation of the polysilicon stringers. As a result, a method is needed to provides for formation of WLs, but prevents formation of the polysilicon stringers and the electrical shorting between adjacent WLs.

SUMMARY

A method of reducing electrical shorting between wordlines of a flash memory device is described herein.

In one aspect, a method of fabricating a memory device to reduce electrical shorting between wordlines includes providing a substrate, forming an insulating layer on the substrate, forming a first polysilicon layer on the insulating layer, forming a second polysilicon layer on the first polysilicon layer, forming a first conductive layer on the second polysilicon layer, forming a mask on the first conductive layer, etching the first conductive layer and a first portion thickness of the second polysilicon layer using the mask to provide an etched sidewall portions of the first conductive layer and an etched upper surface of the second polysilicon layer, forming a liner layer along the etched sidewall portions and the etched upper surface, etching through the liner layer to an upper surface of the insulating layer to pattern the first and second polysilicon layers and forming first and second wordlines, the liner layer remaining on the etched sidewall portions of the first conductive layer, oxidizing exposed portions of the patterned first and second polysilicon layers, and cleaning to remove the oxidized portions, wherein remnant portions of the first polysilicon layer remaining from the step of patterning the first and second polysilicon layers are oxidized and removed during the steps of oxidizing the portions of the patterned first and second polysilicon layers and cleaning the oxidized portions.

In another aspect, a method of fabricating a memory device includes providing a substrate having an insulating layer, forming first, second, and third conductive layers on the insulating layer, forming a mask on the third conductive layer, etching through the third conductive layer and a first portion thickness of the second conductive layer using the mask to provide an etched sidewall portions of the third conductive layer and an etched upper surface of the second polysilicon layer, and forming a liner layer along the etched sidewall portions and the etched upper surface.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIGS. 1A-1C are cross-sectional views of an exemplary method of fabricating a memory device according to a first embodiment;

FIGS. 2A-2D are cross-sectional views of an exemplary method of fabricating a memory device according to a second embodiment.

DETAILED DESCRIPTION

Figure 3:
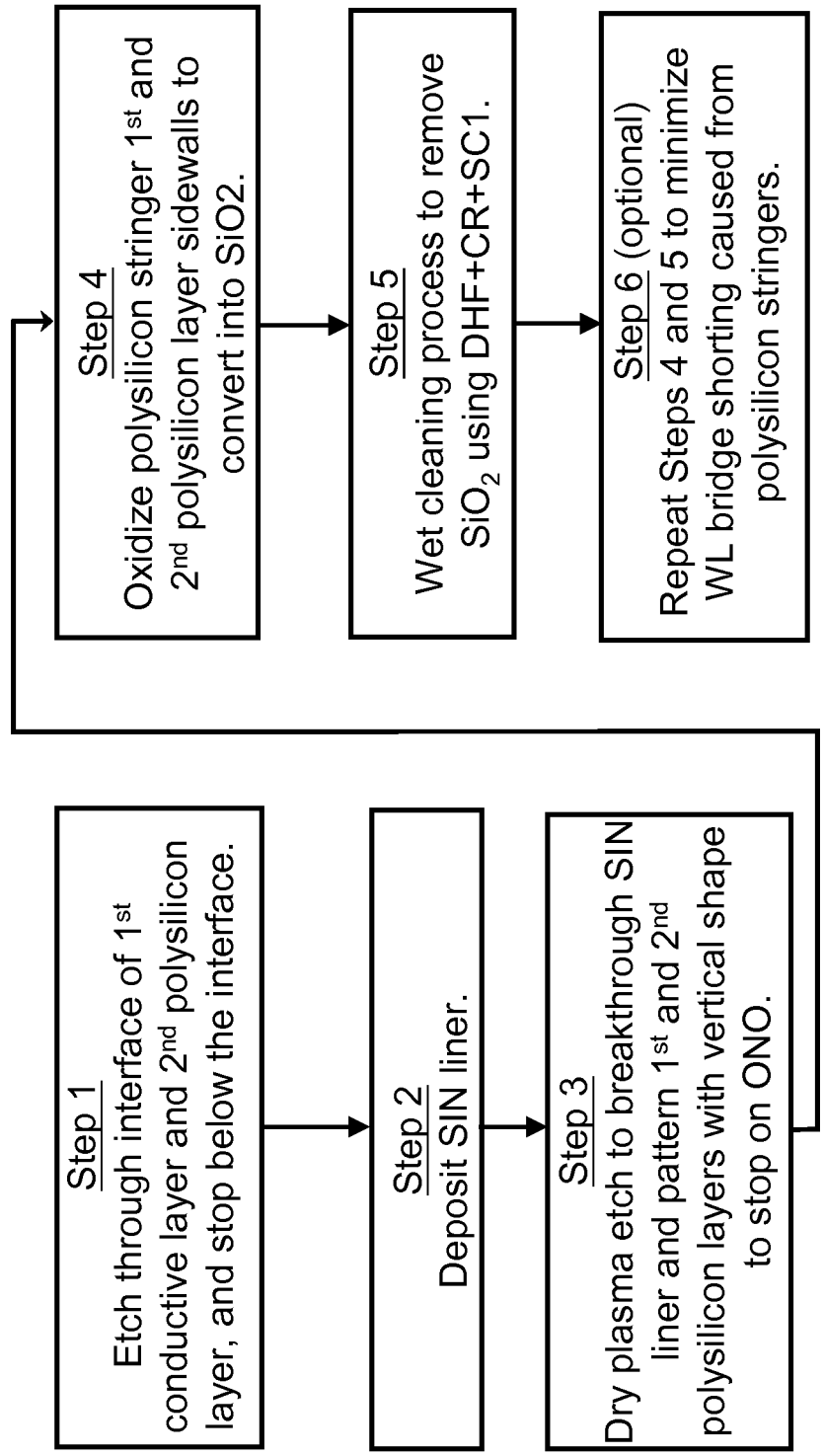
FIG. 3 is a schematic diagram of an exemplary method of fabricating a memory device according to the second embodiment.

FIGS. 1A-1C are cross-sectional views of an exemplary method of fabricating a memory device according to a first embodiment. In FIG. 1A, a partial wordline arrangement 100 of conductive layers is provided for a memory device. Specifically, a first polysilicon layer 110 is provided on an insulating structure 120 that is supported by a substrate. For example, the insulating structure 120 may include a multiple layered stack of oxide-nitride-oxide (ONO) layers. In addition, a second polysilicon layer 130 is provided on the first polysilicon layer 110, and a first conductive layer 140 is provide on the second polysilicon layer 130. In order to etch the partial wordline arrangement 100, a mask 150, such as a tetraethoxysilane hard mask, is formed on an upper surface of the first conductive layer 140.

Next, as shown in FIG. 1B, the partial wordline arrangement 100 undergoes an etching process. Specifically, a portion of the first conductive layer 140 is removed from an upper surface of the second polysilicon layer 130 disposed beneath the mask 150, resulting in the formation of etched sidewalls 140a. In addition, a portion of the second polysilicon layer 130 is removed. Accordingly, a first portion 130a of the second polysilicon layer 130 beneath the mask 150 remains at a first original thickness, and second portions 130b of the second polysilicon layer 130 not beneath the mask 150 are etched and reduced to a second thickness less than the original first thickness.

Next, as shown in FIG. 1C, a liner layer 160 is provided along the etched surfaces of the second portions 130b of the second polysilicon layer 130, as well as along upper and side surfaces of the mask 150. In addition, sidewalls 140a of the first conductive layer 140 are provided with the liner layer 160.

FIGS. 2A-2D are cross-sectional views of an exemplary method of fabricating a memory device according to a second embodiment. Based upon the method of FIGS. 1A-1C, wordline arrangements 200 of conductive layers are provided for a memory device. As shown in FIG. 2A, a liner layer 260 is provided along etched surfaces of second portions 230b of a second polysilicon layer 230, as well as along upper and side surfaces of a mask 250, and sidewalls of a first conductive layer 240 are provided with the liner layer 260.

Next, as shown in FIG. 2B, a wordline etch is performed. For example, a dry plasma etch may be used. Here, the etch removes portions of the liner layer 260 disposed on etched surfaces of the second polysilicon layer 230 and portions of the liner layer 260 formed on upper surfaces of the masks 250. In addition, portions of the second polysilicon layer 230 and the first polysilicon layer 210 are removed between the wordline structures 200. As a result, portions of the insulating structure 220 between the wordline structures 200 are exposed. As a result, unetched portions 260a of the liner layer 260 remain adjacent to the first conductive layer 240. Here, the unetched portions 260a are recessed such that outermost surfaces of the unetched portions 260a are substantially coplanar with the etch outermost surfaces of the first and second polysilicon layers 210 and 230. Moreover, a previously-formed buried oxide 270 is shown disposed substantially surrounding the wordline structures 200.

As shown in FIG. 2B, due to the etching process, a polysilicon stringer 280 may be formed between the etched first polysilicon layers 210. Accordingly, the wordline structures 200 are electrically interconnected by the polysilicon stringer 280, whereby the memory device will be defective. Thus, an additional step may be included that removes the polysilicon stringer without causing damage to other materials of the wordline structures 200.

Next, as shown in FIG. 2C, an oxidation process is performed to oxidize any polysilicon stringers 280 that may remain as a result of the wordline etch. Here, the polysilicon stringers 280 are oxidized along with sidewall regions 290 of the first and second polysilicon layers 210 and 220. However, because the unetched portions 260a of the liner layer 260 remain on sidewall regions of the first conductive layer 240, the first conductive layer 240 is protected and is not oxidized.

Next, as shown in FIG. 2D, a wet cleaning is performed. For example, a wet cleaning can include diluted HF and Standard Clean 1 SC1, which includes ammonium hydroxide and hydrogen peroxide in water. Accordingly, the oxidized polysilicon stringer 280 (in FIGS. 2B and 2C) are removed, as well as oxidized sidewall regions 290 of the first and second polysilicon layers 210 and 220. However, since the first conductive layer 240 is protected by the unetched portions 260a of the liner layer 260, the first conductive layer 240, which may include tungsten silicide ($WSi_x$), for example, is not damaged by the wet cleaning. Thus, the wordline resistance can remain substantially stable.

As shown in FIG. 2D, the wordline structures 200 include first and second polysilicon layers 210 and 230 having sidewalls substantially coplanar with sidewalls of the first conductive layer 240. Accordingly, the wordline structures 200 include substantially columnar shapes with substantially parallel sidewalls. However, if the wordline structures 200 are to include substantially tapered sidewalls, i.e., the distance between opposing sidewalls decreases from an upper surface of the wordline structure towards the substrate, then a larger dimension can be performed. Accordingly, shorter channel length, lower transconductance GM, and higher threshold voltages $V_t$ can be achieved.

Although FIGS. 2A-2D detail a single process for removing polysilicon stringers, the oxidation/cleaning process may be repeated to ensure complete removal of any possible remnant portions of the polysilicon stringers.

FIG. 3 is a schematic diagram of an exemplary method of fabricating a memory device according to the second embodiment. In FIG. 3, a Step 1 includes providing the wordline structure 100 (in FIG. 1A), and etching through an interface between the first conductive layer 140 and the second polysilicon layer 130. However, the etching is limited to just below the interface between the first conductive layer 140 and the second polysilicon layer 130, as shown in FIG. 1B.

Next, a Step 2 includes deposition of a liner layer 160 (in FIG. 1C) or liner layer 260 (in FIG. 2A), which can include includes a dielectric material and/or a ceramic material, such as Silicon nitride (SiN) or Titanium nitride (TiN).

Next, a Step 3 includes dry plasma etching through the liner layer 260 (in FIG. 2B) and patterning of the first and second polysilicon layers 210 and 230. Here, the etching stops at the insulating structure 220. Accordingly, the first and second polysilicon layers 210 and 230 and the first conductive layer 240 have a vertical shape.

Next, a Step 4 includes an oxidizing process to oxidize any polysilicon stringers 280 (in FIG. 2B) that may be formed between adjacent wordline structures 200. In addition, the oxidizing process may oxidize sidewalls 290 of the first and second polysilicon layers 210 and 230.

Next, a Step 5 includes a wet cleaning process to remove the oxidized polysilicon stingers 280 (in FIG. 2C) and the oxidized sidewalls 290. Here, a wet cleaning process can include diluted HF and Standard Clean 1 SC1, which includes ammonium hydroxide and hydrogen peroxide in water.

Then, a Step 6 may be performed that includes a repeat of Steps 4 and 5 in order to remove any residual portions of the polysilicon stingers 280 (in FIG. 2B). Here, Step 6 is optional and may be necessary if Steps 4 and 5, as originally performed, fail to adequately remove all of the polysilicon stingers 280 (in FIG. 2B), or portions thereof. Alternative, Step 6 may be routinely performed to ensure complete removal of the polysilicon stringers 280 (in FIG. 2B)

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method of fabricating a memory device to reduce electrical shorting between wordlines, comprising:
   forming a stacked layer on a substrate, the stacked layer comprising an insulating layer, a first polysilicon layer, a second polysilicon layer, and a conductive layer;
   patterning the conductive layer to provide an etched sidewall of the conductive layer;
   forming a liner layer along the etched sidewall; and
   etching through the stacked layer using a portion of the liner layer as a protective mask to form first and second wordlines, the portion of the liner layer remaining on the etched sidewall of the conductive layer, wherein
   an oxide layer is formed substantially around the stacked layer prior to etching the first polysilicon layer of the stacked layer, and
   the oxide layer is coplanar with the first polysilicon layer.

2. The method of claim 1, wherein the liner layer includes at least one of a dielectric material and a ceramic material.

3. The method of claim 2, wherein the liner layer includes at least one of silicon nitride (SiN) and titanium nitride (TiN).

4. The method of claim 1, wherein the insulating layer includes an ONO layer.

5. The method of claim 1, further comprising:
   oxidizing exposed portions of the polysilicon layer; and
   cleaning to remove the oxidized portions,
   wherein remnant portions of the polysilicon layer remaining from the etching of the stacked layer are oxidized and removed during the oxidizing of the exposed portions of the polysilicon layer and cleaning of the oxidized portions.

6. The method of claim 5, wherein the oxidizing and cleaning are repeated.

7. The method of claim 5, wherein the cleaning provides for a cleaned sidewall of the polysilicon layer that is substantially parallel with the etched sidewall of the conductive layer.

8. The method of claim 5, wherein the conductive layer includes $WiS_x$.

9. The method of claim 5, wherein the liner layer remaining on the etched sidewall of the conductive layer is recessed with respect to the exposed portions of the etched polysilicon layer prior to the oxidizing of exposed portions of the polysilicon layer and cleaning to remove the oxidized portions.

10. A method of fabricating a memory device, comprising:
providing a substrate having an insulating layer;
forming first, second, and third conductive layers on the insulating layer;
forming a mask on the third conductive layer;
etching through the third conductive layer and a portion of the thickness of the second conductive layer using the mask to provide etched sidewall portions of the third conductive layer and an etched upper surface of the second conductive layer;
forming a liner layer along the etched sidewall portions and the etched upper surface; and
etching through the first, second, and third conductive layers using a portion of the liner layer as a protective mask to form first and second wordlines, wherein
an oxide layer is formed substantially around the first conductive layer prior to etching the first conductive layer, and
the oxide layer is coplanar with the first conductive layer.

11. The method of claim 10, wherein the liner layer includes SiN.

12. The method of claim 10, wherein the insulating layer includes an ONO layer.

13. The method of claim 10, wherein the first and second conductive layers include polysilicon.

14. A method of fabricating a memory device, comprising:
providing a substrate having an insulating layer;
forming a protruding structure on the insulating layer; wherein the protruding structure comprises:
a conductive layer having an etched sidewall;
a liner layer over the etched sidewall of the conductive layer; and
first and second polysilicon layer layers between the conductive layer and the insulating layer, the first and second polysilicon layer layers having exposed sidewall sidewalls that extends extend between the insulating layer and the liner layer that is over the etched sidewall of the conductive layer; and
etching through the first and second polysilicon layers using a portion of the liner layer as a protective mask to form first and second wordlines, wherein
an oxide layer is formed substantially around the first polysilicon layer prior to etching the first polysilicon layer, and
the oxide layer is coplanar with the first polysilicon layer.

15. The method of claim 14, wherein the liner layer includes at least one of silicon nitride (SiN) and titanium nitride (TiN).

16. The method of claim 14, wherein the insulating layer includes an ONO layer.

17. The method of claim 14, wherein the forming of the protruding structure includes:
etching the polysilicon layer;
oxidizing exposed portions of the polysilicon layer; and
cleaning to remove the oxidized portions,
wherein remnant portions of the polysilicon layer remaining from the etching of the polysilicon layer are oxidized and removed during the oxidizing of the exposed portions of the etched polysilicon layer and cleaning of the oxidized portions.

18. The method of claim 17, wherein the cleaning provides for the exposed sidewall of the polysilicon layer such that the exposed sidewall is substantially parallel with the etched sidewall of the conductive layer.

19. The method of claim 14, wherein the conductive layer includes $WiS_x$.

20. The method of claim 14, wherein the liner layer remaining on the etched sidewall portions of the conductive layer protrudes relative to the exposed sidewall of the polysilicon layer.

21. The method of claim 1, wherein a thickness of the oxide layer and a thickness of the first polysilicon layer are approximately the same.

* * * * *